US011054479B2

(12) United States Patent
Velev et al.

(10) Patent No.: US 11,054,479 B2
(45) Date of Patent: Jul. 6, 2021

(54) BATTERY CELL FULL LIFE TRACKING SYSTEM

(71) Applicant: Faraday&Future Inc., Gardena, CA (US)

(72) Inventors: Omourtag Alexandrov Velev, La Crescenta, CA (US); Jiepeng Rong, Pasadena, CA (US); Shan Deng, Arcadia, CA (US)

(73) Assignee: Faraday&Future Inc., Gardena, CA (US)

( * ) Notice: Subject to any disclaimer, the term of this patent is extended or adjusted under 35 U.S.C. 154(b) by 0 days.

(21) Appl. No.: 16/839,010

(22) Filed: Apr. 2, 2020

(65) Prior Publication Data
US 2020/0233034 A1    Jul. 23, 2020

Related U.S. Application Data

(63) Continuation of application No. 15/720,175, filed on Sep. 29, 2017, now abandoned.
(Continued)

(51) Int. Cl.
*G01R 31/385* (2019.01)
*G01R 1/02* (2006.01)
(Continued)

(52) U.S. Cl.
CPC ............ *G01R 31/385* (2019.01); *B60L 53/63* (2019.02); *B60L 55/00* (2019.02); *G01R 1/025* (2013.01);
(Continued)

(58) Field of Classification Search
CPC .... G01R 31/00; G01R 31/36; G01R 31/3627; G01R 31/3655; G01R 31/367; G01R 31/382; G01R 31/385; G01R 31/386; G01R 31/3865; G01R 31/396; G01R 1/025; H02J 7/00; H02J 7/0013; H02J 7/0021; H01M 10/00; H01M 10/42; H01M 10/4285; H01M 10/48; B60L 11/1842; B60L 11/1844; B60L 53/00; B60L 53/60; B60L 53/63; B60L 55/00
(Continued)

(56) References Cited

U.S. PATENT DOCUMENTS 5,951,229 A * 9/1999 Hammerslag ........... B60L 53/80
414/398
7,915,860 B2 * 3/2011 Quint .................... G06Q 10/087
320/132
(Continued)

*Primary Examiner* — Hoai-An D. Nguyen
(74) *Attorney, Agent, or Firm* — Knobbe Martens Olson & Bear LLP

(57) ABSTRACT

Certain embodiments are described that provide a method and computer readable media for testing battery cells. A unique identifier (e.g., barcode) is affixed to a battery cell which allows it to be tracked across separate tests as a cell, in a module, string, pack, etc. Using a GUI, the unique identifier is recorded in a database along with at least a battery cell manufacturer and a battery cell model. A designation of the particular tester channel or module or string location is entered into the database in association with the unique identifier. Test results of the first test are electronically transferred from the first tester to the database along with the corresponding channel designations.

14 Claims, 16 Drawing Sheets

Related U.S. Application Data

(60) Provisional application No. 62/402,988, filed on Sep. 30, 2016.

(51) Int. Cl.
*H01M 10/42* (2006.01)
*H01M 10/48* (2006.01)
*B60L 53/63* (2019.01)
*B60L 55/00* (2019.01)
*H02J 7/00* (2006.01)

(52) U.S. Cl.
CPC .... *G01R 31/3865* (2019.01); *H01M 10/4285* (2013.01); *H01M 10/48* (2013.01); *H02J 7/0021* (2013.01)

(58) Field of Classification Search
USPC ........ 324/425, 426, 432, 434, 500, 512, 718
See application file for complete search history.

(56) References Cited

U.S. PATENT DOCUMENTS

| | | | |
|---|---|---|---|
| 8,866,443 B2* | 10/2014 | Abe | G01R 31/367 320/132 |
| 9,537,354 B2* | 1/2017 | Bell | H04B 5/0031 |
| 2012/0299721 A1* | 11/2012 | Jones | B60R 25/33 340/521 |
| 2014/0280073 A1* | 9/2014 | Sutton | G06F 16/25 707/722 |
| 2015/0048836 A1* | 2/2015 | Guthrie | A61B 5/14532 324/427 |
| 2016/0232736 A1* | 8/2016 | Holtappels | H01M 10/4257 |
| 2019/0113911 A1* | 4/2019 | Hamaya | G05B 23/0213 |
| 2019/0114619 A1* | 4/2019 | Wilson | G06Q 20/3563 |

* cited by examiner

| Field module |
|---|
| Current |
| Voltage |
| Charge_Capacity |
| Discharge_Energy |
| dV/dt |
| Internal_Resistance |
| AC_Impedance |
| |
| |

| X_Axis | |
|---|---|
| Cycle_Index | |

Control range
Maximum
333
Minimum
222
OK  Cancel

| Y_Axis | △ |
|---|---|
| Current | △ |
| Voltage | △ |
| Charge_Capacity | △ |
| | |
| | | calculate
MAX V
MIN
EVG

Calculate:
= Voltage/Current

Name:
Resistance

| Field |
|---|
| Curre |
| Volta |
| .... |

| Filter | | |
|---|---|---|
| v | DateTime | △ |
| v | Cycle_Index | △ |
| v | Battery ID | △ |
| | Discharge_Energy | △ |
| | dV/dt | △ |
| | Internal_Resistance | △ |
| | AC_Impedance | △ |

| Graphical selection |
|---|
| Line chart |
| Bar chart |
| Pie chart |

NAME  Charge and Discharge ***

DCIR

OK  Cancel

FIG. 14A

BATTERY CELL FULL LIFE TRACKING SYSTEM

CROSS-REFERENCE TO RELATED APPLICATIONS

This application is a continuation of U.S. patent application Ser. No. 15/720,175, filed Sep. 29, 2017, and claims the benefit of U.S. Provisional Application No. 62/402,988, filed Sep. 30, 2016, the entirety of which is hereby incorporated by reference.

BACKGROUND

Aspects of the disclosure relate to the testing of battery cells, such as battery cells for an electric vehicle.

Modern electric vehicles use battery packs that are comprised of hundreds of individual battery cells. Often these individual battery cells are purchased in bulk batches that may vary slightly due to small variances across the battery cell manufacturer's production systems. A method of automatically validating and tracking each battery cell and monitoring its performance through its entire life is desirable.

SUMMARY

Certain embodiments are described that provide a method for testing battery cells. A unique identifier, such as a barcode, is assigned to an individual battery cell. The unique identifier is recorded in a database along with at least a battery cell manufacturer and a battery cell model. A first tester is provided at least one individual cell test for the individual battery cell in a particular channel of the first tester. A designation of the particular channel in association with the unique identifier is received. Test results of the individual cell test are electronically received from the first tester for storage in the database along with the corresponding channel designations. The test results of the individual cell test from the first tester are stored in the database in association with the unique identifier. At least one module test on the individual battery cell and other battery cells is provided. Test results of the module test are electronically received. The test results of the module test are stored in the database.

In one embodiment, a method for testing a battery cell or other object is described. A first unique identifier is affixed to a battery cell or other test object. A second unique identifier is affixed to a test apparatus or a channel of the test apparatus. A third unique identifier corresponding to a test is generated. The first, second and third unique identifiers are scanned to produced scanned codes. The scanned codes are sent to a program. The program downloads the test identified by the third unique identifier to the test apparatus identified by the second unique identifier for testing the object identified by the first unique identifier.

BRIEF DESCRIPTION OF THE DRAWINGS

Aspects of the disclosure are illustrated by way of example. In the accompanying figures, like reference numbers indicate similar elements.

FIGS. 14A and 14B show an embodiment of a module of FIG. 13; and

DETAILED DESCRIPTION

Examples are described herein in the context of tracking battery cell parameters. Those of ordinary skill in the art will realize that the following description is illustrative only and is not intended to be in any way limiting. Reference will now be made in detail to implementations of examples as illustrated in the accompanying drawings. The same reference indicators will be used throughout the drawings and the following description to refer to the same or like items.

In the interest of clarity, not all of the routine features of the examples described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

Figure 1:
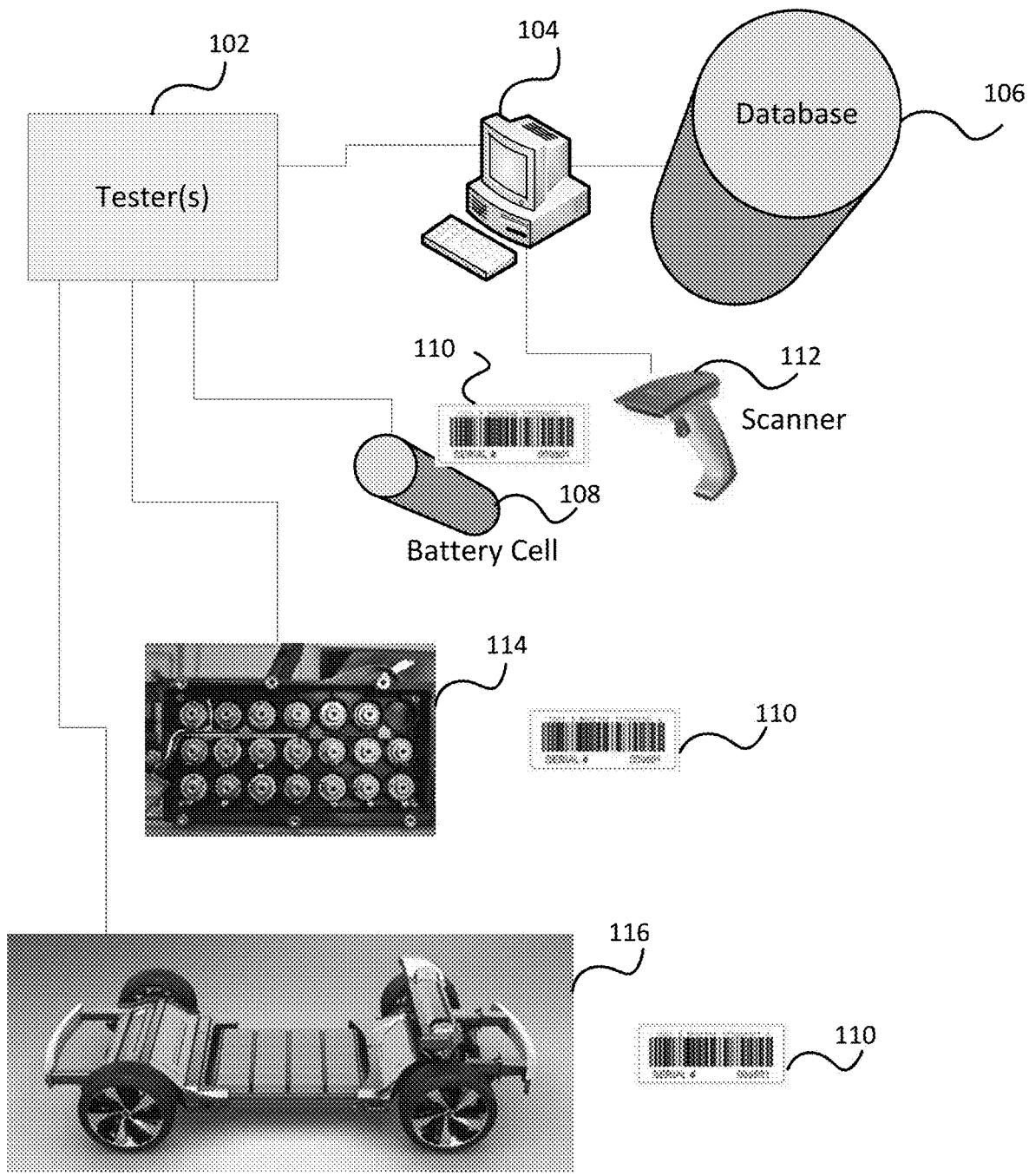
FIG. 1 shows an embodiment of a testing system across multiple manufacturing environments.

FIG. 1 shows an embodiment of a testing system across multiple manufacturing environments. A tester or testers 102 is controlled by a computer 104. Computer 104 operates under programmed control, and stores test schedules, parameters and test data in a database 106. A battery cell 108 is tracked by applying a barcode 110 or other ID. A scanner 112 can detect the barcode and load it into computer 104. Instead of a barcode, another identifier can be used, such as a QR code, a unique ID number, an image or hologram, etc.

The system provides for accurate tracking of a particular battery cell across multiple testing environments. Battery cell 108 is first tested individually, and then it is monitored as part of a test of a battery cell module 114. The cell and module can then be measured as part of a test on a string of modules (not shown), and then a number of strings can be tested in a pack of modules 116. The same barcode 110 allows tracking the individual battery cell across all of these tests, with the barcode being associated with the appropriate channel in the tester.

In one embodiment, the database 106 is comprised of a single or multiple databases. A non-relational database, such as a NoSQL database with a dynamic structure may be used, allowing different data sizes in different fields. This accommodates different sizes of test results from one test to another, different test parameter sizes, etc. One such database is the Mongo® database. In one embodiment, an Arbin™ and/or Macor™ battery tester is used. The computer analysis uses Python analysis scripts in one embodiment. A custom GUI is used in one embodiment, also incorporating a Battlab GUI.

Figure 2:
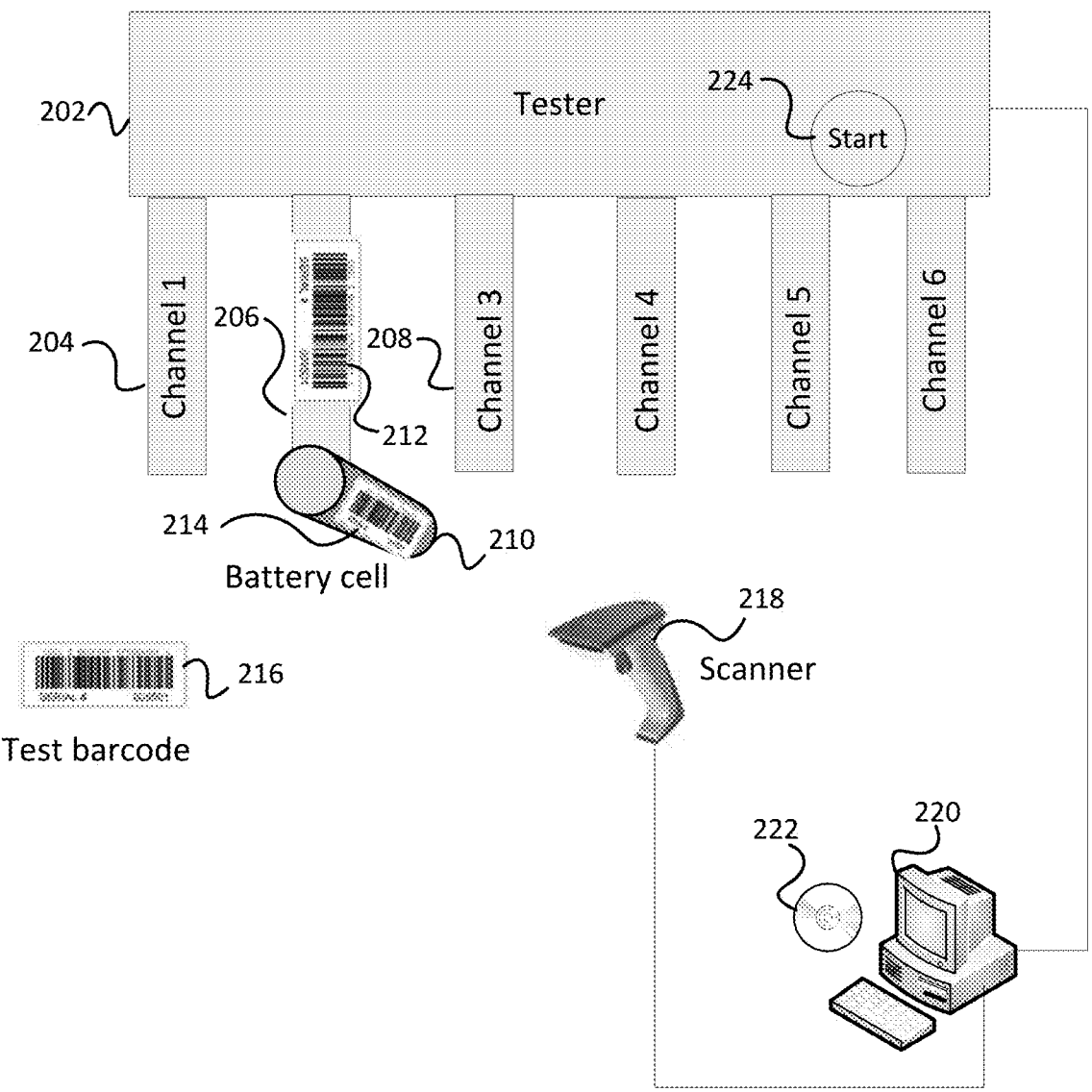
FIG. 2 is a diagram illustrating the use of barcodes or other identifiers to initiate a test according to one embodiment.

FIG. 2 is a diagram illustrating the use of barcodes or other identifiers to initiate a test according to one embodiment. A battery cell tester 202 has a number of channels for testing individual battery cells, such as channels 204, 206 and 208. A battery cell 210 is shown attached to channel 206, which is known to the tester as channel 2. A first barcode 214 is affixed to battery cell 210, and a second barcode 212 is affixed to channel 206. The generation of the various barcodes and associating them with the corresponding data is described below with respect to the test GUI. As described below, a third, test barcode 216 is generated, and corresponds to a particular test (steps, parameters, etc.) in a test control program.

A test technician uses a scanner 218 to scan all 3 barcodes into a program on a non-transitory computer readable media 222 in a computer 220. This links the identified battery cell with the identified tester channel for the identified test. The program in computer 220 will pull up the test previously associated with test barcode 216, and download the test to tester 202 (test steps, parameters, etc.). This eliminates the need for the test technician to manually enter the test data on the tester 202. After the test is downloaded, the test technician presses a start button 224 on tester 202 to initiate the test. The program in computer 220 will periodically pull updated test data from tester 202 and store it in a database.

In alternate embodiments, the test can be started automatically upon scanning the test barcode, by the computer instructing the tester to initiate the test after the test has been downloaded. Alternately, the test technician can activate a start icon on a GUI provided by the program on computer 220.

Figure 3:
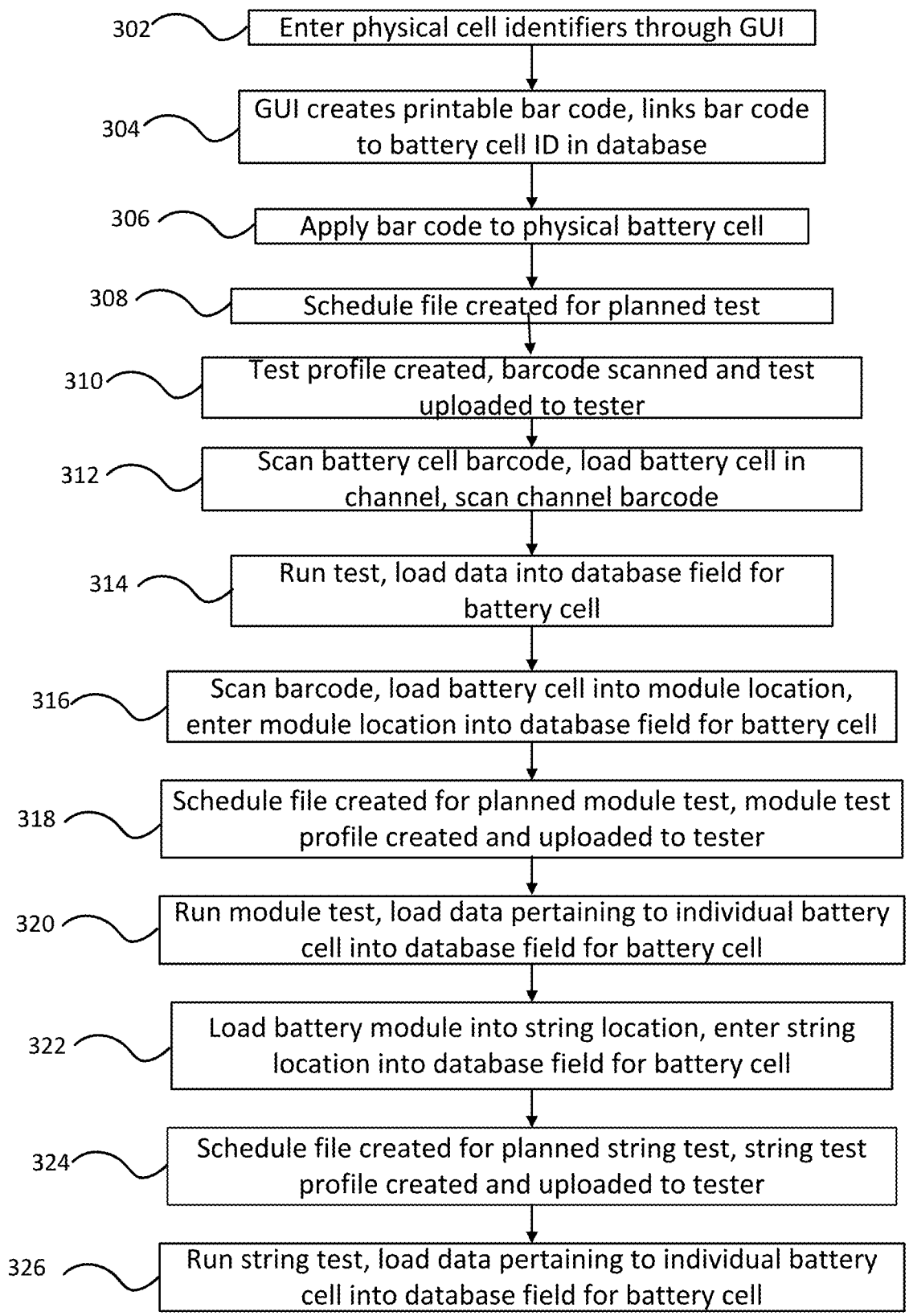
FIG. 3 is a diagram illustrating a testing process across multiple modules according to an embodiment.

FIG. 3 is a diagram illustrating a testing process across multiple modules according to an embodiment. Parameters for particular battery cells to be tested are entered into the database through the GUI (step 302). The parameters can include:
  Manufacturer
  Model
  Chemistry
  Dimensions
  Weight
  Initial OCV (Open Circuit Voltage)
  Initial ACIR (Alternating Current Internal Resistance)
  Entry Date Computer 104 then generates a unique barcode for the battery cell, and assigns the battery code to a field associated with the battery identifiers (step 304). Using a GUI, the barcode can be printed on a label by a lab engineer or technician. The label is then applied to the physical battery cell (306). A schedule file is created for the planned test (308). The test profile is created and a barcode for the test is generated, scanned by the technician, and uploaded to tester 102 (310). The test profile, or an ID of the test, can be stored in the database associated with the battery cell ID or barcode. When the battery cell is inserted into the tester, the barcode is scanned, along with the barcode for the channel of the tester, and is associated with the battery cell (312). The test is then run, and the test result data is loaded into the database associated with the battery cell channel/barcode.

For a second series of tests, the battery cell can be loaded into a battery module. The same tester or a different tester can be used. The battery cell barcode is scanned again and associated with the location in the module, with the module location being entered through the GUI (step 316). A module location can be provided with a separate barcode, or its location can be entered through GUI fields. A schedule file is created for the planned test and the test profile is created and uploaded to the tester (318). The module test is then run, and the module test result data is loaded into the database associated with the battery cell channel/barcode (320). In the module, the entire module can be tested, as well as individual battery cells. In both cases, the parameters of the individual cell are recorded, and stored in the database entry associated with the battery cell barcode.

For a third series of tests, the battery cell module can be loaded into a battery string. The same tester or a different tester can be used. The battery cell barcode is associated with the location of the module in the string, with the module location being entered through a barcode or the GUI (step 322). A schedule file is created for the planned test and the test profile is created and uploaded to the tester (324). The module test is then run, and the module test result data is loaded into the database associated with the battery cell channel/barcode (326). In the module, the entire string can be tested, as well as individual modules and battery cells.

The process can be repeated with the battery string loaded into a battery pack, with the location of the string in the pack being entered into the database. Thus, the pack, string, and module locations of the battery cell are associated with the barcode. Although particular types of sub-assemblies and assemblies have been described, the invention can be used with other assembly and sub-assembly configurations.

Test Profiles

In one embodiment, test profiles are created that each defines a test. The test profiles are loaded into a test profile database, and can be accessed through a GUI and be loaded automatically to run each test. In one embodiment, the program interfaces with a GUI of a test machine (e.g., Arbin™ machine), designed for manually entering data. The data fields are recognized and automatically populated. This reduces chances of human error.

Test GUI

The GUI requires each user to log in and differentiates between different types of users:
  1. Administrators (user console level)—can define/change tests profiles, add and delete test profiles.
  2. Editors—can run different tests, start and stop tests, and add and delete tests.
  3. Subscribers—can view results, but only have read-only access.

The GUI connects to a number of different types of databases, including the "test profile" database, the test results database, and the battery cell parameters database. Alternately, these databases can be combined.

The GUI allows access to the different databases to provide data on the test, test machine and battery cell. In one embodiment, the following information is provided:
Cell Selection:
  Cell Brand
  Cell Model
  Cell Number
Test Selection:
  Test Category
  Test Type Test Name
Schedule
Test input
Machine/Channel Selection
  Machine Brand
  Machine Model
  Machine Number
  Machine Channel In addition, the GUI allows selection of a particular bar-code scanner.

In one embodiment, both reference performance tests (prescribed protocol tests) and actual cycling tests are performed. The cycling tests are repeated at different test cycles corresponding to different road conditions for a vehicle battery. The reference tests are conducted in-between different cycle tests to see what has changed—e.g., how much battery cell capacity has been lost. In one embodiment, the tests set forth in Table 1 below are conducted:

TABLE 1

| Reference Performance Test | Actual Cycling Test |
|---|---|
| Discharge C/4 Energy [Wh] and Capacity [Ah] | Charge And Discharge Energy [Wh] |
| Voltage vs Ah vs Time[min] | |
| Total Charge and Discharge Durations [min] | Charge and Discharge Capacity [Ah] |
| Voltage vs Ah vs Time[min | |
| Coulombic and Energy Efficiencies [%] | End Of Discharge Voltage [V] |
| OCV per SOC Point | |
| DCR Calculation via the Slope Method per SOC per Time [Ohm] and its associated Current and Voltage Values | |
| DCR Calculation via the OCV method per SOC Per time [Ohm] its associated Current and Voltage Values | |
| Specific Energy [kWh/kg] | |
| Specific Power [kW/kg] | |

A testing GUI is provided in one embodiment to control test set-up, testing, and test result uploading. A particular test machine may perform tests at regular intervals, such as once every 0.1-1 second. The test data may be recorded locally by the machine. In one embodiment, the test data is examined every 2-30 minutes, depending on the volume of data. The data is examined to determine what data is new or has changed since the last examination. The new or changed data may then uploaded over the Internet to a server(s) and database(s) in the cloud. The uploaded data can then be downloaded for analytics under control of a analytics and report generation GUI as described below.

Figure 4:
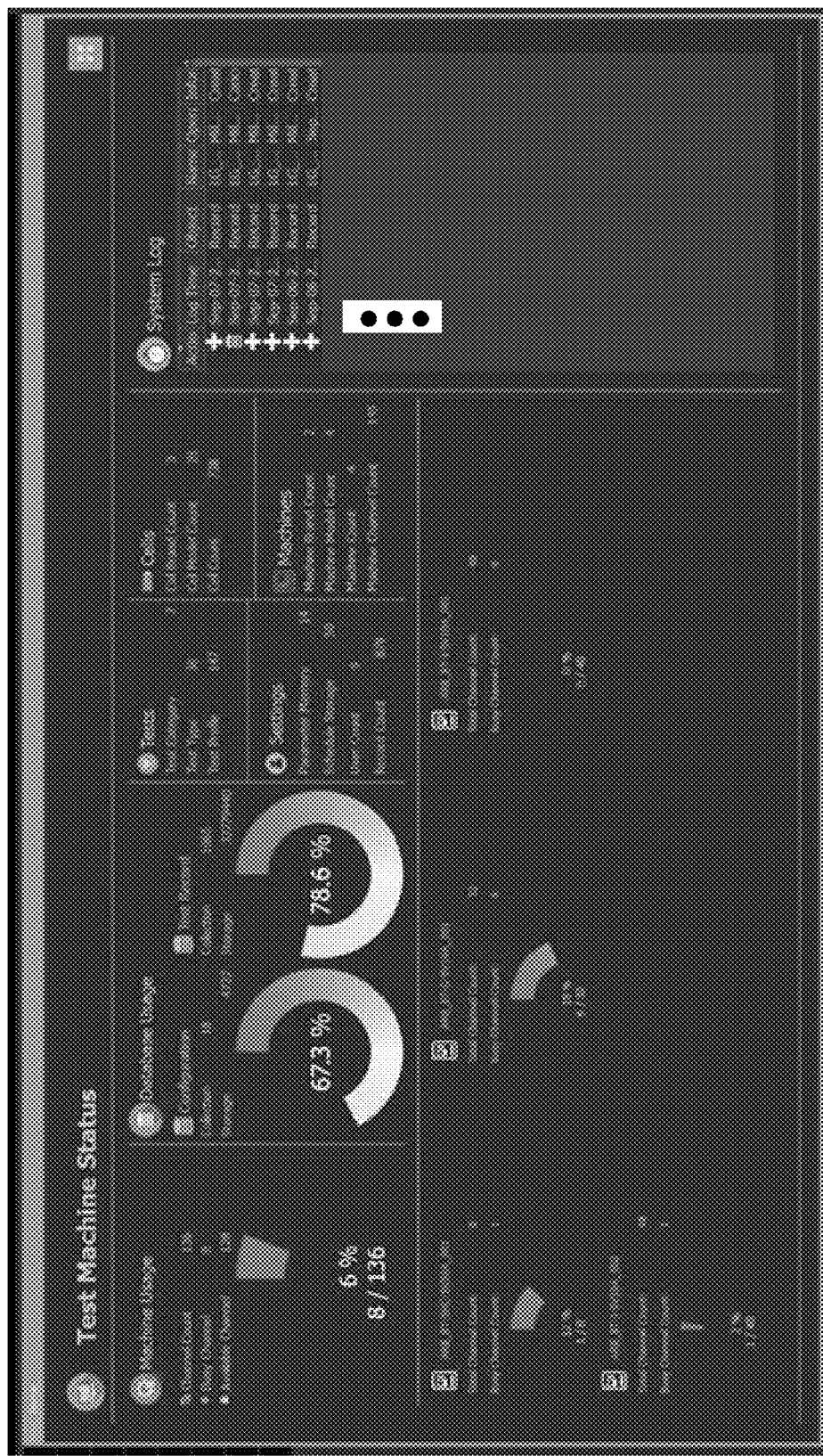
FIG. 4 is a diagram of a test control program GUI for overall test machine status according to an embodiment.

FIG. 4 is a diagram of a test control program (tool) GUI for overall test machine status according to an embodiment. This screen is the home page of the tool and shows:
  a. Current status of the databases and also status of all machines and channels.
  b. Real-time testing monitoring, showing all current test statuses.
  c. System logging (recent activities, with last 30 records shown).

This screen shows the machine and database usage, as well as overall data on tests, cells, settings and machines. A system log is also provided to track actions taken. The machine usage shows the channel count, busy channels and available channels. The database usage shows both configuration and test records. The test data shows the number of test categories, test types and test profiles. The cell information shows the cell brand count, cell model count and cell count. The settings information shows numbers for parameter memory, schedule storage, user count and record count. The machine information shows the numbers for machine brand count, machine model count, machine count and machine channel count.

Figure 5:
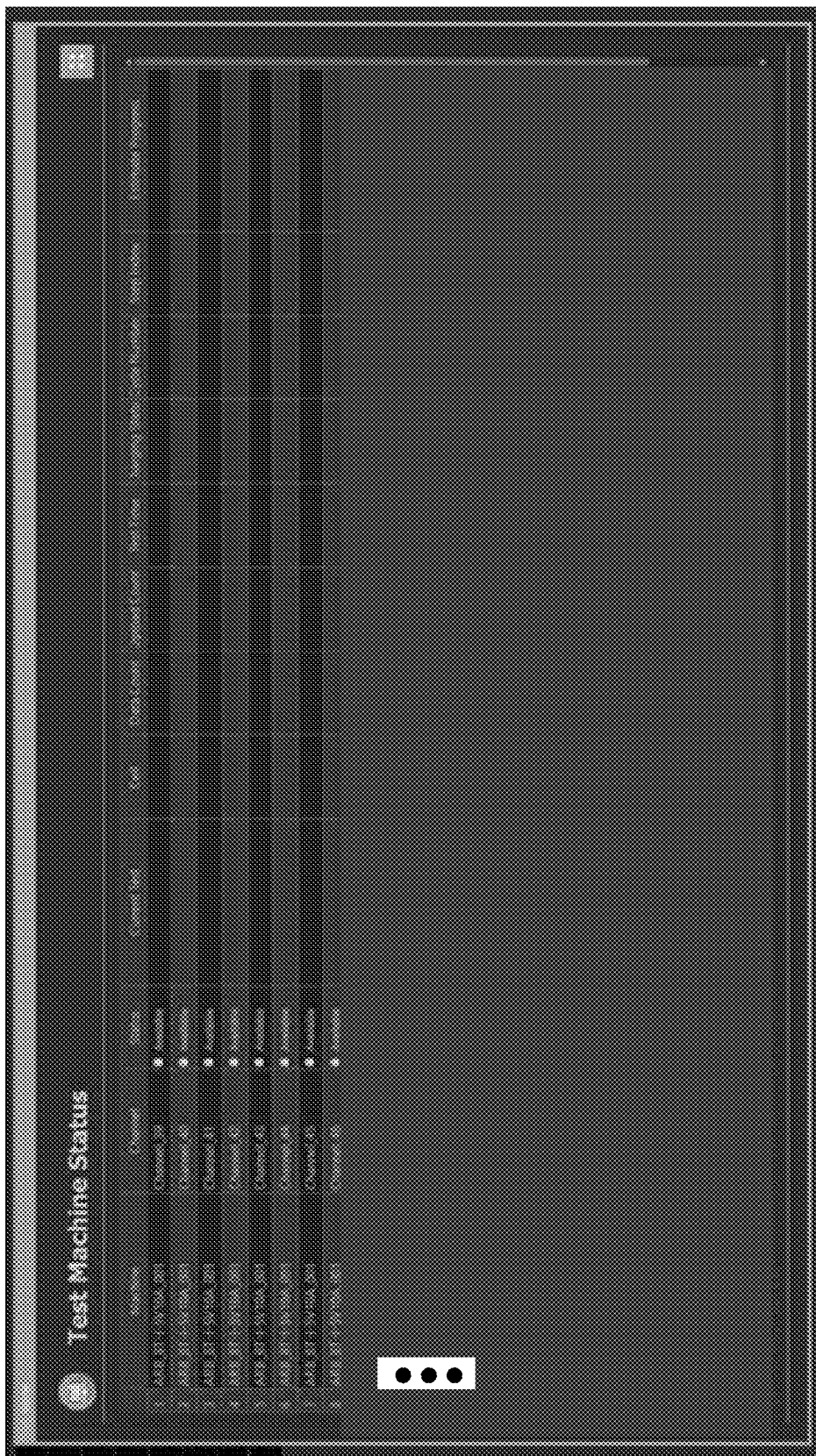
FIG. 5 is a diagram of a test control program GUI for test machine channel status according to an embodiment.

FIG. 5 is a diagram of a test control program GUI for test machine channel status according to an embodiment. The columns identify the machine, channel, status, current test, cell, data count, upload count, test time, charging status, cycle number, step index and estimate of progress.

Figure 6:
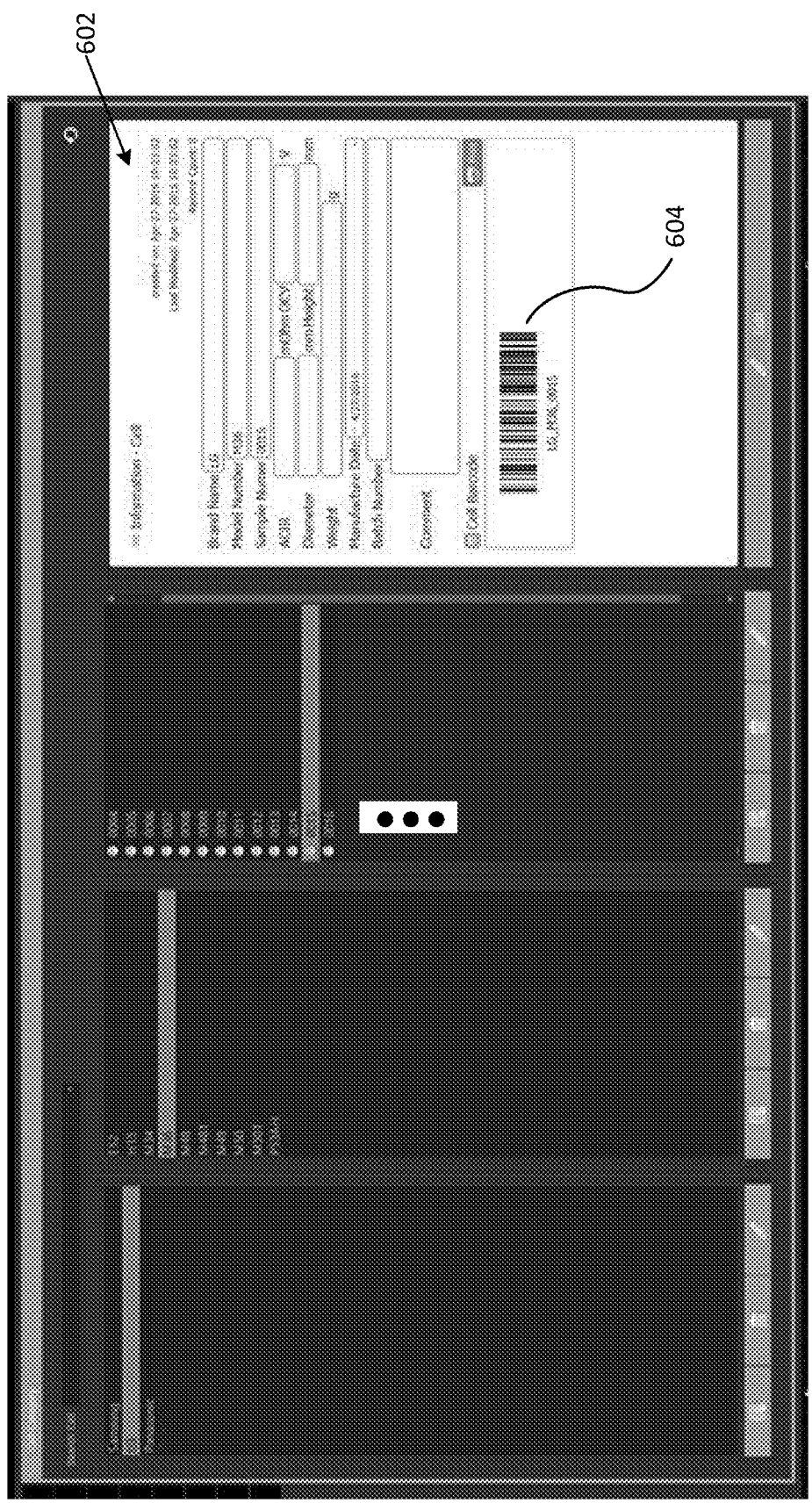
FIG. 6 is a diagram of a test control program GUI for battery cell information according to an embodiment.

FIG. 6 is a diagram of a test control program GUI for battery cell information according to an embodiment. The system uses a database to store data for all cells. The following features are provided:
  a. Each cell has a barcode number used as ID.
  b. The barcode can be used to track all records of the cell.
  c. The user can add/edit/delete cell (brand, model) entries in this window.

Figure 7:
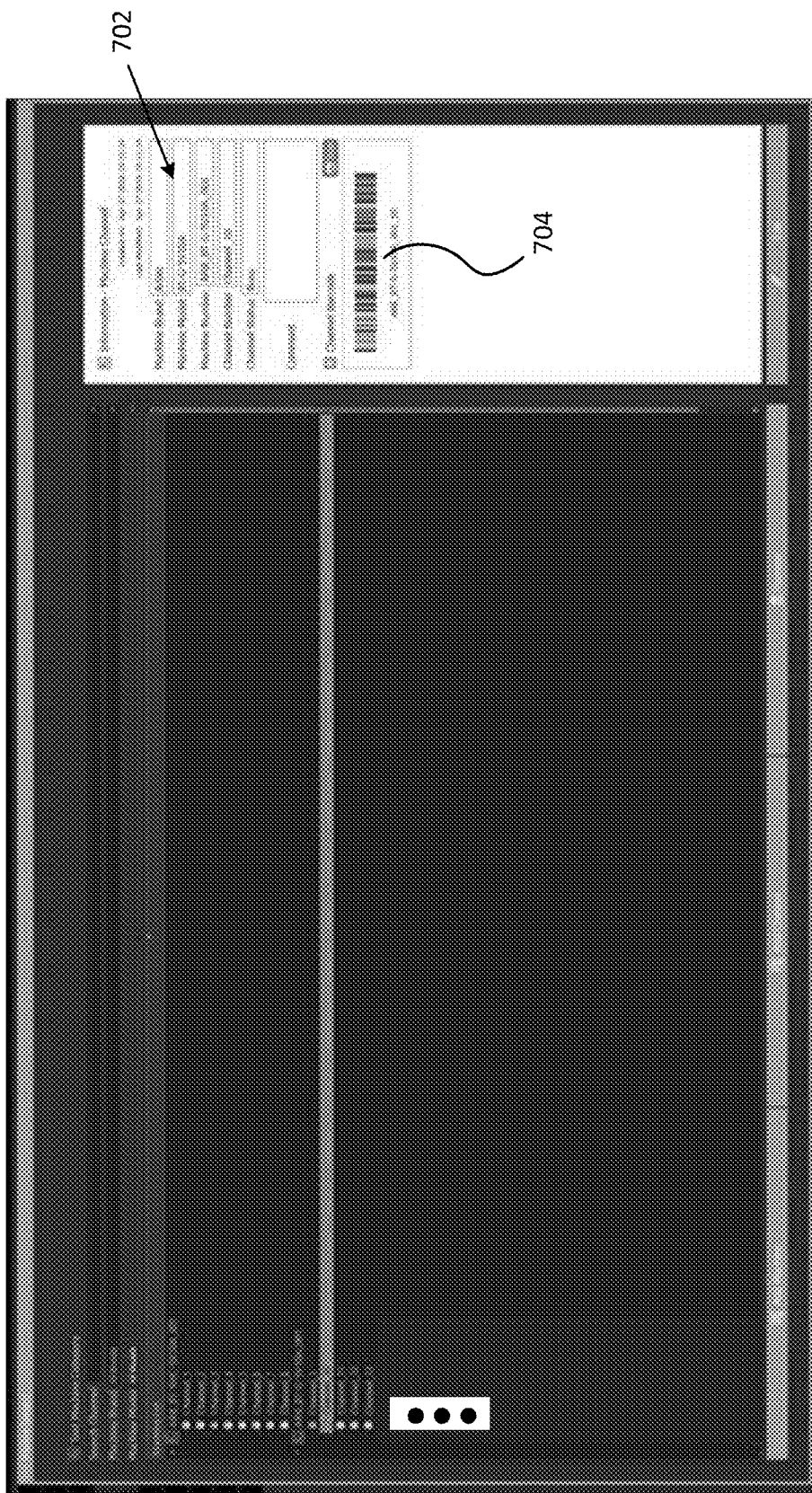
FIG. 7 is a diagram of a test control program GUI for test machine channel information according to an embodiment.
Figure 8:
FIG. 8 is a diagram of a test control program GUI for test information according to an embodiment.

The left three columns show the result of a cell search, showing the brand name in the first column, the model number in the second column and the sample number in the third column. A window 602 shows data previously entered via a cell data entry screen, which includes an assigned barcode 604 and the following information:
  Brand name
  Model number
  Sample number
  ACIR
  mOhm OCV
  Diameter
  MM Height
  Weight
  Manufacture date
  Batch number FIG. 7 is a diagram of a test control program GUI for test machine channel information according to an embodiment. The machine database stores information about test machines and channels. Separate GUI displays are provided for (a) brand and model configuration, (b) machine and channel storage, (c) changing status of a machine or channel and (d) adding a new machine/channel/brand/model. FIG. 7 shows and embodiment of (b), the machine and channel storage GUI. For a selected machine and channel, box 702 provides a printable barcode 704 and the following information:
  Machine brand
  Machine model
  Machine number
  Channel number
  Channel status FIG. 8 is a diagram of a test control program GUI for test information according to an embodiment. A test profile database is accessed. Separate GUI screens are provided for:
  a. Storing all test profiles the lab user designed for different testing purposes.
  b. Storing all input/parameter controls for each profile to avoid user input error.
  c. Storing testing schedule file for test machine. (The user can download it from this tool and use it for a machine test).
  d. Administrative user enabled to add/edit/delete any test profiles in this window.

Figure 9:
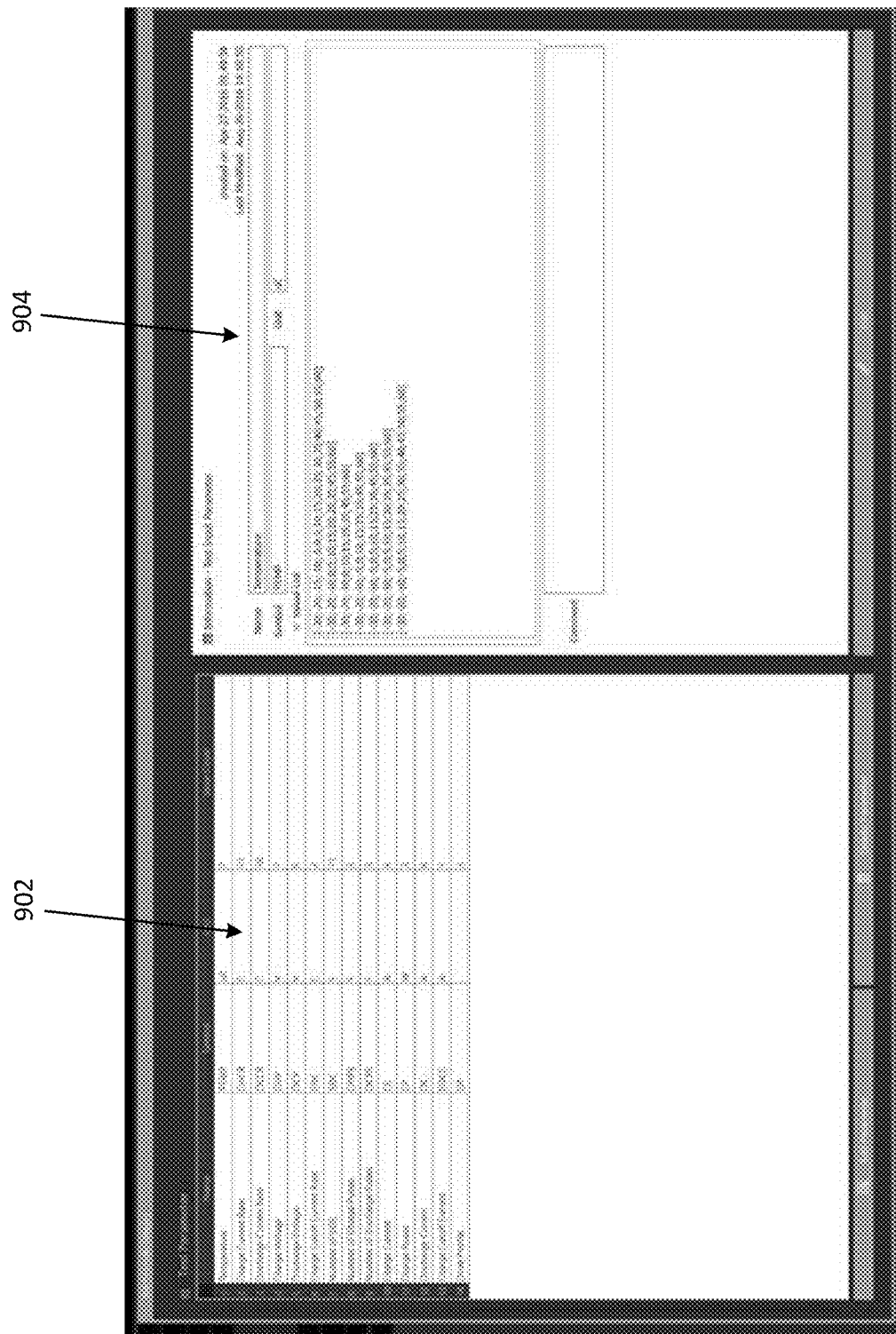
FIG. 9 is a diagram of a test control program GUI for test parameters according to an embodiment.

FIG. 8 shown a particular cycle of a test selected, with details provided in a box 802. The box shows the barcode 804 assigned to the test, along with the following information for the particular cycle:

Category
Type
Test name
Test code
Schedule file
Test input parameters, including:
Temperature
Charge Current
Charge Voltage
Discharge Current
Discharge Voltage FIG. 9 is a diagram of a test control program GUI for test parameters according to an embodiment. Various test parameters are shown in window 902, with the data recorded for a selected parameter (temperature in this example) shown in window 904. The data is periodically uploaded from the tester memory, with new and changed data only being uploaded in one embodiment. The data is then stored in a test data database linked to the test and cell information.

Figure 10:
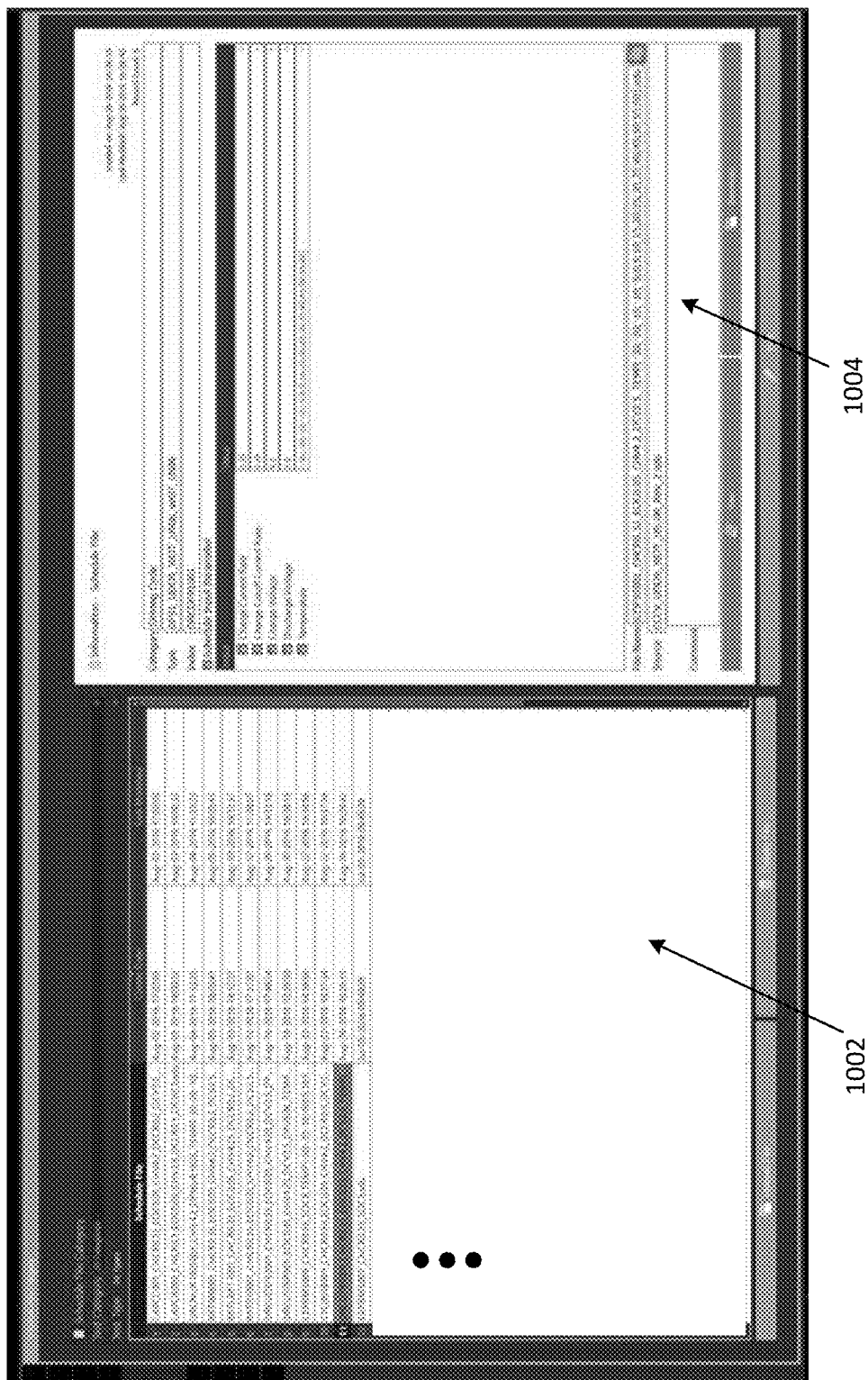
FIG. 10 is a diagram of a test control program GUI for test schedules according to an embodiment.
Figure 11:
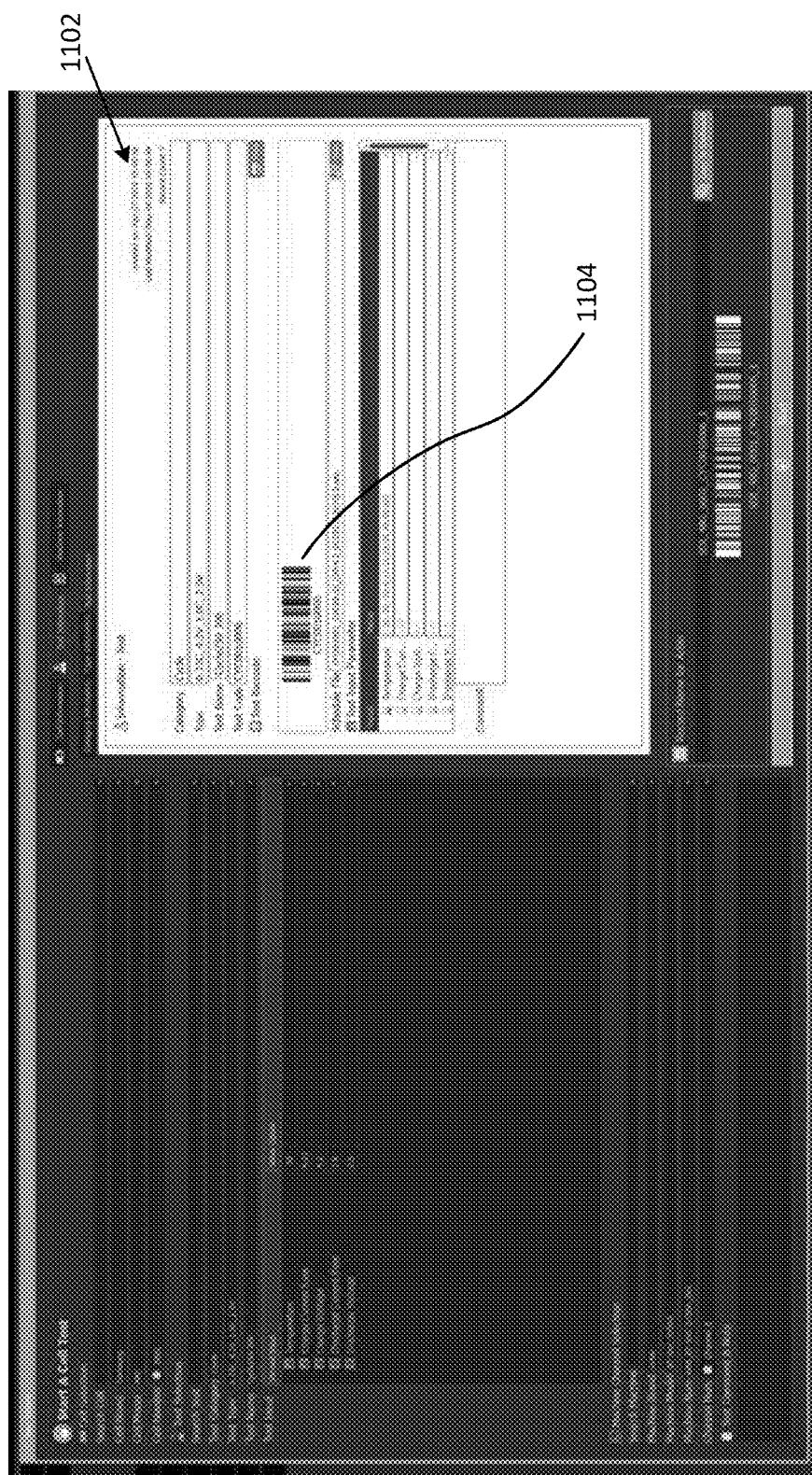
FIG. 11 is a diagram of a test control program GUI for starting a test according to an embodiment.

FIG. 10 is a diagram of a test control program GUI for test schedules according to an embodiment. A window 1002 shows the schedule files, along with the create data and last modified date. For a selected schedule file, window 1004 shows the details, including:

Category
Type
Index
Schedule input parameters:
Charge current rate
Charge cutoff current rate
Charge voltage
Discharge voltage
Temperature FIG. 11 is a diagram of a test control program GUI for starting a test according to an embodiment. Cell selection and test selections are displayed, along with data on each. A window 1102 shows test information, such as described in FIG. 10. Also, a test barcode 1104 is shown. To start a test, the following steps are executed:

Select the target cell that is to be used for the test.
Select the test profile to be used.
Select the desired parameter values.
Select the machine and channels.
Print barcodes for cell, machine/channel and test, affix them and scan them, then click "Start" on the tester.

Figure 12:
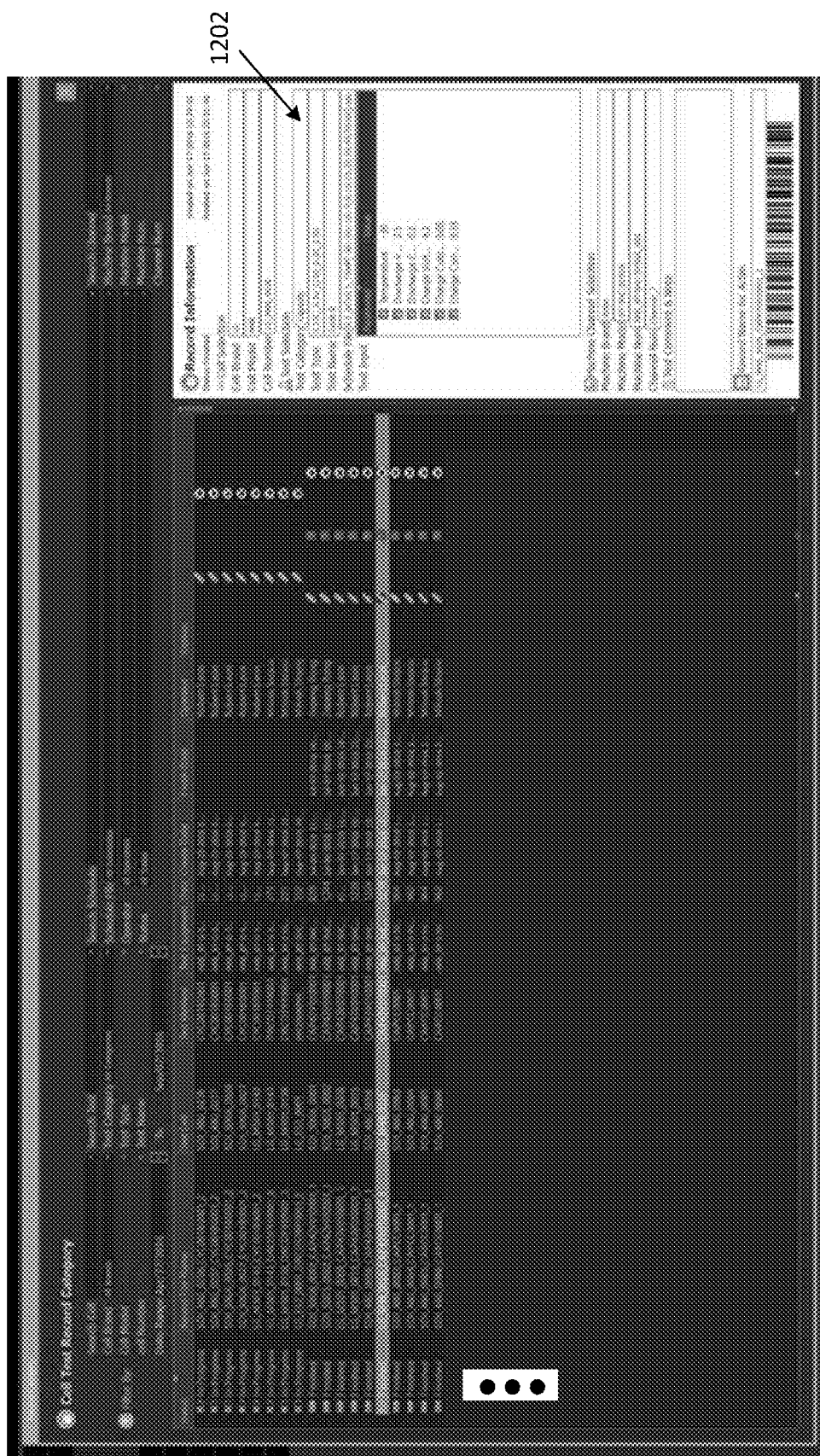
FIG. 12 is a diagram of a test control program GUI for test information tracked according to an embodiment.

FIG. 12 is a diagram of a test control program GUI for test information tracked according to an embodiment. This screen is a record window showing, for each test, its status (in progress or finished), along with the record information in window 1202 for a selected test. Window 1202 shows information about the cell, test and machine, as was as the test input parameters.

Analytics and Report Generation GUI

Figure 13:
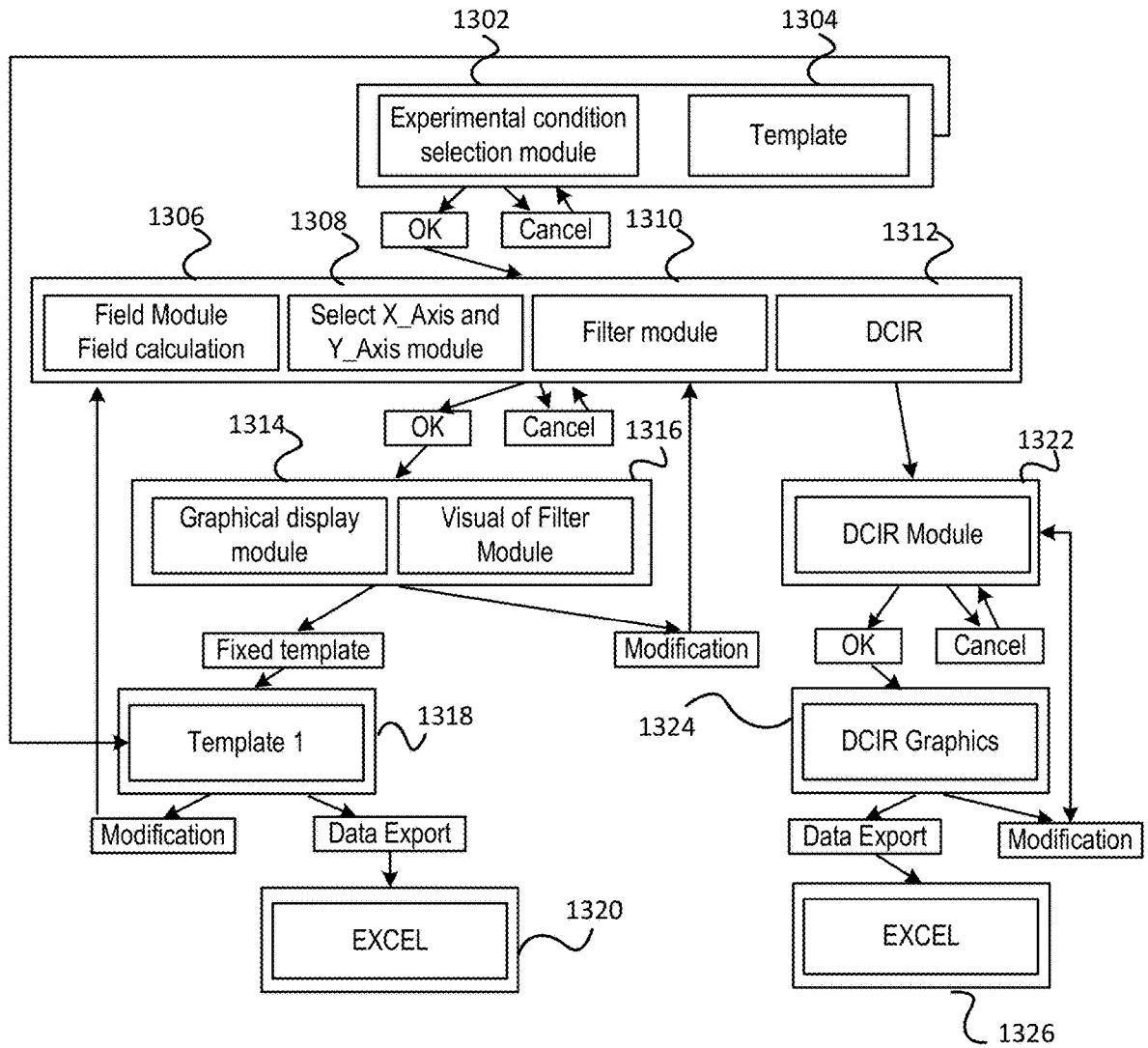
FIG. 13 shows an embodiment of a testing and report generation GUI.

FIG. 13 shows an embodiment of an analytics and report generation GUI. This GUI is used for analytics, including chart generation, of the data uploaded to the cloud.

An experimental condition selection module 1302 provides various test templates 304 organized under different categories of tests. Various parameters can be specified, such as battery cell type. A particular schedule file can be selected, along with a test date and time.

The GUI also provides a field module 1306, an x-y axis selection module 1308, a filter module 1310 and a DCIR (Direct Current Internal Resistance) module 1312. The field module 1306 can be used to select one of current, voltage, charge capacity, discharge energy, dV/t, internal resistance and AC impedance. The x-y axis module can be used to select a cycle index for the x-axis and a field for the y axis (e.g., current, voltage, charge capacity). The filter module 1310 allows filtering based on the different fields.

Figure 14B:
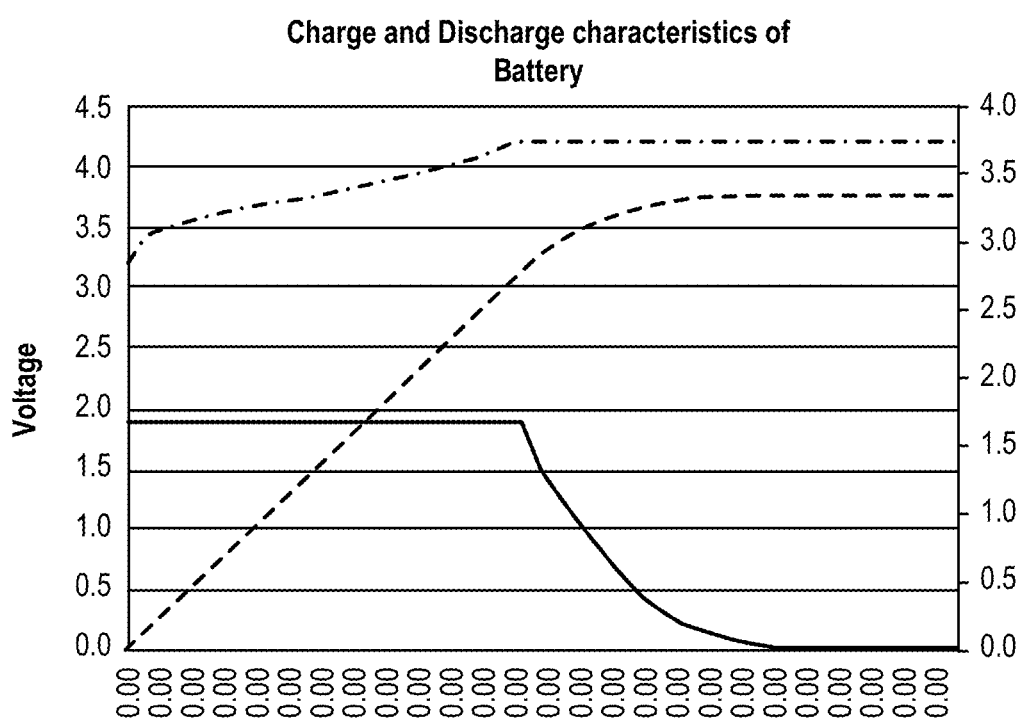

FIG. 14A illustrates the various displays and selections of modules 1306, 1308, 1310 and 1312. A graphical output of charge and discharge characteristics according to one embodiment is illustrated in FIG. 14B.

Returning to FIG. 13, a graphical display module 1314 and Visual filter module 1316 are provided. The graphical display module allows customizing of the graphical output, such as that shown in FIG. 14B. The visual filter module allows customization of the displayed fields shown adjacent the graph. Template 1318 is used by modules 1314 and 1316, with the data also being exported to an Excel or other spreadsheet 1320.

DCIR module 1322 allows specification of when the DCIR is measured and recorded. It can be measured for all steps, or just for specified steps in a test sequence. The output is provided in graphical form through DCIR graphics module 1324, and to an Excel or other spreadsheet 1326.

Computer System

Figure 15:
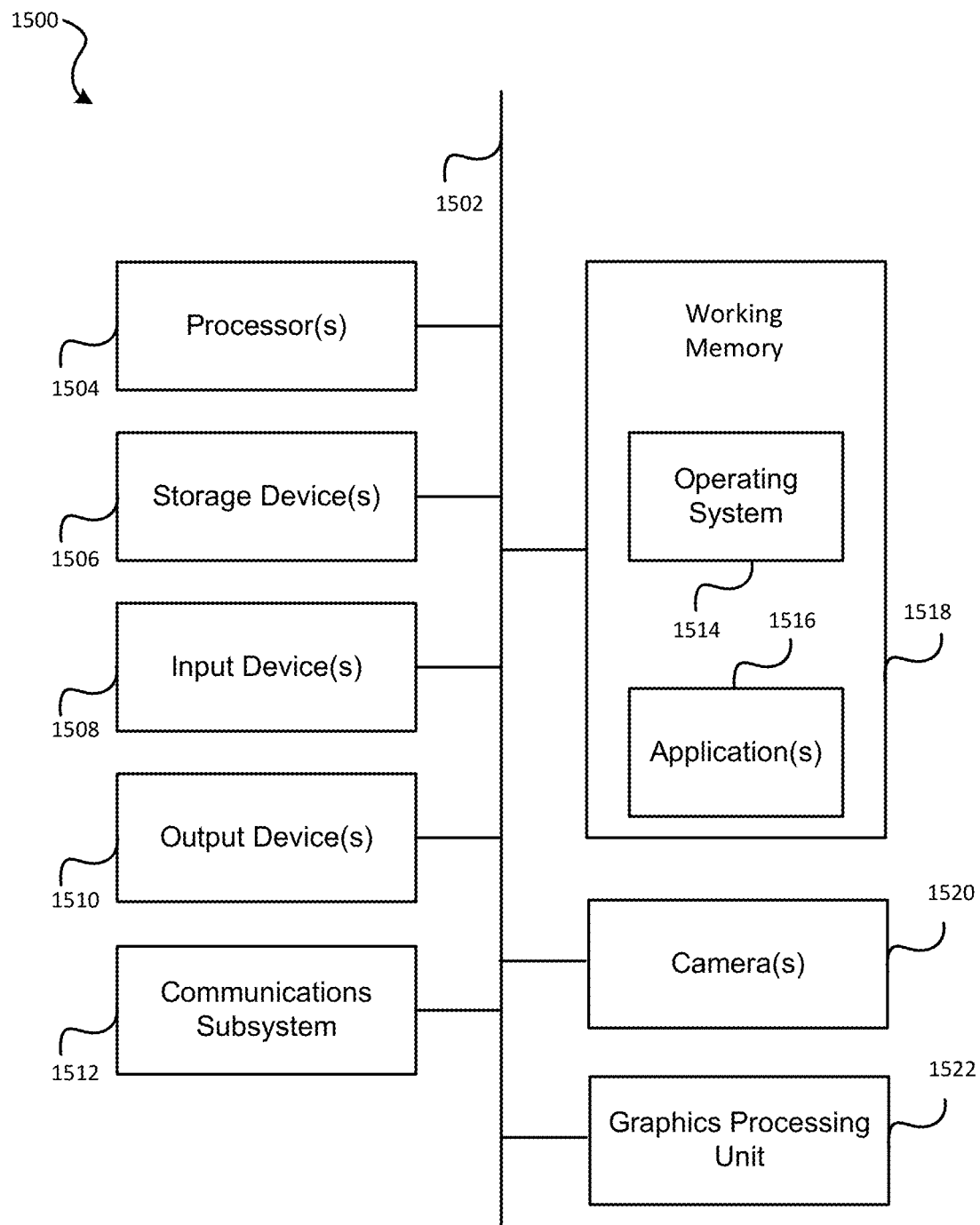
FIG. 15 illustrates an example of a computing system in which one or more embodiments may be implemented.

FIG. 15 illustrates an example of a computing system in which one or more implementations may be implemented.

A computer system as illustrated in FIG. 15 may be incorporated as part of the above described computer for controlling a battery tester. For example, computer system 1500 can represent some of the components of a display, a computing device, a server, a desktop, a workstation, a control or interaction system in an automobile, a tablet, a netbook or any other suitable computing system. A computing device may be any computing device with an image capture device or input sensory unit and a user output device. An image capture device or input sensory unit may be a camera device. A user output device may be a display unit. Examples of a computing device include but are not limited to video game consoles, tablets, smart phones and any other hand-held devices. FIG. 15 provides a schematic illustration of one implementation of a computer system 1500 that can perform the methods provided by various other implementations, as described herein, and/or can function as the host computer system, a remote kiosk/terminal, a telephonic or navigation or multimedia interface in an automobile, a computing device, a set-top box, a table computer and/or a computer system. FIG. 15 is meant only to provide a generalized illustration of various components, any or all of which may be utilized as appropriate. FIG. 15, therefore, broadly illustrates how individual system elements may be implemented in a relatively separated or relatively more integrated manner.

The computer system 1500 is shown comprising hardware elements that can be electrically coupled via a bus 1502 (or may otherwise be in communication, as appropriate). The hardware elements may include one or more processors 1504, including without limitation one or more general-purpose processors and/or one or more special-purpose processors (such as digital signal processing chips, graphics processing units 1522, and/or the like); one or more input devices 1508, which can include without limitation one or more cameras, sensors, a mouse, a keyboard, a microphone configured to detect ultrasound or other sounds, and/or the like; and one or more output devices 1510, which can include without limitation a display unit such as the device used in implementations of the invention, a printer and/or the like. Additional cameras 1520 may be employed for detection of user's extremities and gestures. In some implementations, input devices 1508 may include one or more sensors such as infrared, depth, and/or ultrasound sensors.

The graphics processing unit 1522 may be used to carry out the method for real-time wiping and replacement of objects described above.

In some implementations of the implementations of the invention, various input devices 1508 and output devices 1510 may be embedded into interfaces such as display devices, tables, floors, walls, and window screens. Furthermore, input devices 408 and output devices 1510 coupled to the processors may form multi-dimensional tracking systems.

The computer system 1500 may further include (and/or be in communication with) one or more non-transitory storage devices 1506, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data storage, including without limitation, various file systems, database structures, and/or the like.

The computer system 1500 might also include a communications subsystem 1512, which can include without limitation a modem, a network card (wireless or wired), an infrared communication device, a wireless communication device and/or chipset (such as a Bluetooth device, an 802.11 device, a Wi-Fi device, a WiMax device, cellular communication facilities, etc.), and/or the like. The communications subsystem 1512 may permit data to be exchanged with a network, other computer systems, and/or any other devices described herein. In many implementations, the computer system 1500 will further comprise a non-transitory working memory 1518, which can include a RAM or ROM device, as described above.

The computer system 1500 also can comprise software elements, shown as being currently located within the working memory 1518, including an operating system 1514, device drivers, executable libraries, and/or other code, such as one or more application programs 1516, which may comprise computer programs provided by various implementations, and/or may be designed to implement methods, and/or configure systems, provided by other implementations, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a computer-readable storage medium, such as the storage device(s) 1506 described above. In some cases, the storage medium might be incorporated within a computer system, such as computer system 1500. In other implementations, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which may be executable by the computer system 1500 and/or might take the form of source and/or installable code, which, upon compilation and/or installation on the computer system 1500 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed. In some implementations, one or more elements of the computer system 1500 may be omitted or may be implemented separate from the illustrated system. For example, the processor 1504 and/or other elements may be implemented separate from the input device 1508. In one implementation, the processor may be configured to receive images from one or more cameras that are separately implemented. In some implementations, elements in addition to those illustrated in FIG. 15 may be included in the computer system 1500.

Some implementations may employ a computer system (such as the computer system 1500) to perform methods in accordance with the disclosure. For example, some or all of the procedures of the described methods may be performed by the computer system 1500 in response to processor 1504 executing one or more sequences of one or more instructions (which might be incorporated into the operating system 1514 and/or other code, such as an application program 1516) contained in the working memory 1518. Such instructions may be read into the working memory 1518 from another computer-readable medium, such as one or more of the storage device(s) 1506. Merely by way of example, execution of the sequences of instructions contained in the working memory 1518 might cause the processor(s) 1504 to perform one or more procedures of the methods described herein.

The terms "machine-readable medium" and "computer-readable medium," as used herein, refer to any medium that participates in providing data that causes a machine to operate in a specific fashion. In some implementations implemented using the computer system 1500, various computer-readable media might be involved in providing instructions/code to processor(s) 1504 for execution and/or might be used to store and/or carry such instructions/code (e.g., as signals). In many implementations, a computer-readable medium may be a physical and/or tangible storage medium. Such a medium may take many forms, including but not limited to, non-volatile media, volatile media, and transmission media. Non-volatile media include, for example, optical and/or magnetic disks, such as the storage device(s) 1506. Volatile media include, without limitation, dynamic memory, such as the working memory 1518. Transmission media include, without limitation, coaxial cables, copper wire and fiber optics, including the wires that comprise the bus 1502, as well as the various components of the communications subsystem 1512 (and/or the media by which the communications subsystem 1512 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 1504 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 1500. These signals, which might be in the form of electromagnetic signals, acoustic signals, optical signals and/or the like, are all examples of carrier waves on which instructions can be encoded, in accordance with various implementations of the invention.

The communications subsystem 1512 (and/or components thereof) generally will receive the signals, and the bus 1502 then might carry the signals (and/or the data, instructions, etc. carried by the signals) to the working memory 1518, from which the processor(s) 1504 retrieves and executes the instructions. The instructions received by the working memory 1518 may optionally be stored on a non-transitory storage device 406 either before or after execution by the processor(s) 1504.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Moreover, nothing disclosed herein is intended to be dedicated to the public.

While some examples of methods and systems herein are described in terms of software executing on various machines, the methods and systems may also be implemented as specifically-configured hardware, such as field-programmable gate array (FPGA) specifically to execute the various methods. For example, examples can be implemented in digital electronic circuitry, or in computer hardware, firmware, software, or in a combination thereof. In one example, a device may include a processor or processors. The processor comprises a computer-readable medium, such as a random access memory (RAM) coupled to the processor. The processor executes computer-executable program instructions stored in memory, such as executing one or more computer programs. Such processors may comprise a microprocessor, a digital signal processor (DSP), an application-specific integrated circuit (ASIC), field programmable gate arrays (FPGAs), and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices.

Such processors may comprise, or may be in communication with, media, for example computer-readable storage media, that may store instructions that, when executed by the processor, can cause the processor to perform the steps described herein as carried out, or assisted, by a processor. Examples of computer-readable media may include, but are not limited to, an electronic, optical, magnetic, or other storage device capable of providing a processor, such as the processor in a web server, with computer-readable instructions. Other examples of media comprise, but are not limited to, a floppy disk, CD-ROM, magnetic disk, memory chip, ROM, RAM, ASIC, configured processor, all optical media, all magnetic tape or other magnetic media, or any other medium from which a computer processor can read. The processor, and the processing, described may be in one or more structures, and may be dispersed through one or more structures. The processor may comprise code for carrying out one or more of the methods (or parts of methods) described herein.

The foregoing description of some examples has been presented only for the purpose of illustration and description and is not intended to be exhaustive or to limit the disclosure to the precise forms disclosed. Numerous modifications and adaptations thereof will be apparent to those skilled in the art without departing from the spirit and scope of the disclosure.

Reference herein to an example or implementation means that a particular feature, structure, operation, or other characteristic described in connection with the example may be included in at least one implementation of the disclosure. The disclosure is not restricted to the particular examples or implementations described as such. The appearance of the phrases "in one example," "in an example," "in one implementation," or "in an implementation," or variations of the same in various places in the specification does not necessarily refer to the same example or implementation. Any particular feature, structure, operation, or other characteristic described in this specification in relation to one example or implementation may be combined with other features, structures, operations, or other characteristics described in respect of any other example or implementation.

Use herein of the word "or" is intended to cover inclusive and exclusive OR conditions. In other words, A or B or C includes any or all of the following alternative combinations as appropriate for a particular usage: A alone; B alone; C alone; A and B only; A and C only; B and C only; and A and B and C.

What is claimed is:

1. A method for testing battery cells comprising: assigning a unique identifier to an individual battery cell;
   recording the unique identifier in a database along with at least a battery cell manufacturer and a battery cell model;
   providing to a first tester at least one individual cell test for the individual battery cell in a particular channel of the first tester;
   receiving a designation of the particular channel in association with the unique identifier;
   electronically receiving test results of the individual cell test from the first tester for storage in the database along with the corresponding channel designations;
   storing the test results of the individual cell test from the first tester in the database in association with the unique identifier;
   providing at least one module test on the individual battery cell and other battery cells in a module;
   electronically receiving test results of the module test; and storing the test results of the module test in the database;
   mounting the module into a particular string location in a string;

providing at least one string test for the individual battery cell and other battery cells;

transferring test results of the string test to the database; and storing the test results of the string test in the database in association with the unique identifier;

mounting the string into a particular pack location in a pack;

providing at least one pack test for the battery cell and other battery cells;

transferring test results of the pack test to the database; and storing the test results of the string test in the database in association with the unique identifier.

2. The method of claim 1 further comprising:
providing in a GUI a display chart of test results, including at least charge and discharge characteristics.

3. The method of claim 1 wherein the database is a NoSQL database with a dynamic structure.

4. The method of claim 1 wherein the unique identifier is a bar code.

5. The method of claim 1 further comprising:
identifying a test abnormality from the module test;
comparing the test results of the module test with the test results of the individual cell test; and
determining whether the test abnormality is caused by the individual cell or the module.

6. The method of claim 1 further comprising:
storing a digital representation of a test profile of the individual cell test and of a test profile of the module test in the database; and
loading the digital representation of the individual cell test from the database into the first tester.

7. The method of claim 2 further comprising:
providing a filter module in the GUI; and
changing the chart of test results in real time in response to changes in filter parameters in the filter module.

8. A non-transitory, computer readable media containing computer readable instructions for testing battery cells, comprising instructions for:
assigning a unique identifier to an individual battery cell;
recording the unique identifier in a database along with at least a battery cell manufacturer and a battery cell model;
providing to a first tester at least one individual cell test for the individual battery cell in a particular channel of the first tester;
receiving a designation of the particular channel in association with the unique identifier;
electronically receiving test results of the individual cell test from the first tester for storage in the database along with the corresponding channel designations;

storing the test results of the individual cell test from the first tester in the database in association with the unique identifier;
providing at least one module test on the individual battery cell and other battery cells in a module;
electronically receiving test results of the module test; and storing the test results of the module test in the database;
mounting the module into a particular string location in a string;
providing at least one string test for the individual battery cell and other battery cells;
transferring test results of the string test to the database; and
storing the test results of the string test in the database in association with the unique identifier;
mounting the string into a particular pack location in a pack;
providing at least one pack test for the battery cell and other battery cells;
electronically transferring test results of the pack test to the database; and
storing the test results of the string test in the database in association with the unique identifier.

9. The non-transitory, computer readable media of claim 8 further comprising instructions for:
storing a digital representation of a test profile of the individual cell test and of a test profile of the module test in the database; and
loading the digital representation of the individual cell test from the database into the first tester.

10. The non-transitory, computer readable media of claim 8 further comprising:
providing in a GUI a display chart of test results, including at least charge and discharge characteristics.

11. The non-transitory, computer readable media of claim 10 further comprising instructions for:
providing a filter module in the GUI; and
changing the chart of test results in real time in response to changes in filter parameters in the filter module.

12. The non-transitory, computer readable media of claim 8 wherein the database is a NoSQL database with a dynamic structure.

13. The non-transitory, computer readable media of claim 8 wherein the unique identifier is a bar code.

14. The non-transitory, computer readable media of claim 8 further comprising instructions for:
identifying a test abnormality from the module test;
comparing the test results of the module test with the test results of the individual cell test; and
determining whether the test abnormality is caused by the individual cell or the module.

* * * * *